United States Patent [19]

Goodman et al.

[11] Patent Number: 5,255,783
[45] Date of Patent: Oct. 26, 1993

[54] EVACUATED WAFER CONTAINER

[75] Inventors: John B. Goodman; Kirk J. Mikkelsen, both of Chanhassen, Minn.

[73] Assignee: Fluoroware, Inc., Chaska, Minn.

[21] Appl. No.: 811,783

[22] Filed: Dec. 20, 1991

[51] Int. Cl.$^5$ ............................................. B65D 85/48
[52] U.S. Cl. ................................... 206/334; 206/454; 206/524.8; 141/65; 141/98
[58] Field of Search ............ 206/328, 334, 454, 524.8; 141/98, 65; 118/500, 501

[56] References Cited

U.S. PATENT DOCUMENTS

| | | | |
|---|---|---|---|
| 4,061,228 | 12/1977 | Johnson | 206/334 |
| 4,434,891 | 3/1983 | Skinner et al. | 206/524.8 |
| 4,577,650 | 3/1986 | McConnell | 206/454 |
| 4,684,021 | 8/1987 | Neibling et al. | 206/334 |
| 4,718,549 | 1/1988 | Rissotti et al. | 118/500 |
| 4,724,874 | 2/1988 | Parikh et al. | 141/98 |
| 4,739,882 | 4/1988 | Parikh et al. | 206/454 |
| 4,966,519 | 10/1990 | Davis et al. | 118/500 |
| 5,024,329 | 6/1991 | Grohrock | 206/334 |
| 5,054,418 | 10/1991 | Thompson et al. | 206/454 |

OTHER PUBLICATIONS

Gunawardena et al, "SMIF and its Impact on Cleanroom Automation", Microcontamination, Sep. 1985.
Geany, et al, "Self-Sealing Shake-Proof Wafer Carrier", IBM Technical Disclosure Bulletin, vol. 9, No. 6, Nov., 1976, pp. 2069 and 2070.

Primary Examiner—David T. Fidei
Attorney, Agent, or Firm—Palmatier, Sjoquist & Helget

[57] ABSTRACT

A container and a method of storing semiconductor wafers, wherein a closed container has sealed top and bottom portions of molded plastic material and uniquely adapted for storing semiconductor wafers, the container having, in one of its parts, a gas receiving stem and valve for removing a portion of the gaseous atmosphere within the container as to store the semiconductor wafers in a partial vacuum, one portion of the container may incorporate a thin wall of the molded container comprising a flexible membrane adjacent edges of the semiconductor wafers to be drawn against the wafers and hold them in place within the container; the walls of the closed container being covered with a diamond-like coating; and a method of storing semiconductor wafers by confining the wafers in a multipart container, sealing the container, and modifying the atmosphere within the container as by reducing the gas pressure within the container, changing the gaseous atmosphere in the container by, in some cases, substituting an inert gas for the air within the container, and relieving the vacuum pressure within the container as the container is to be opened, by supplying clean air into the container with minimial particulate.

3 Claims, 2 Drawing Sheets

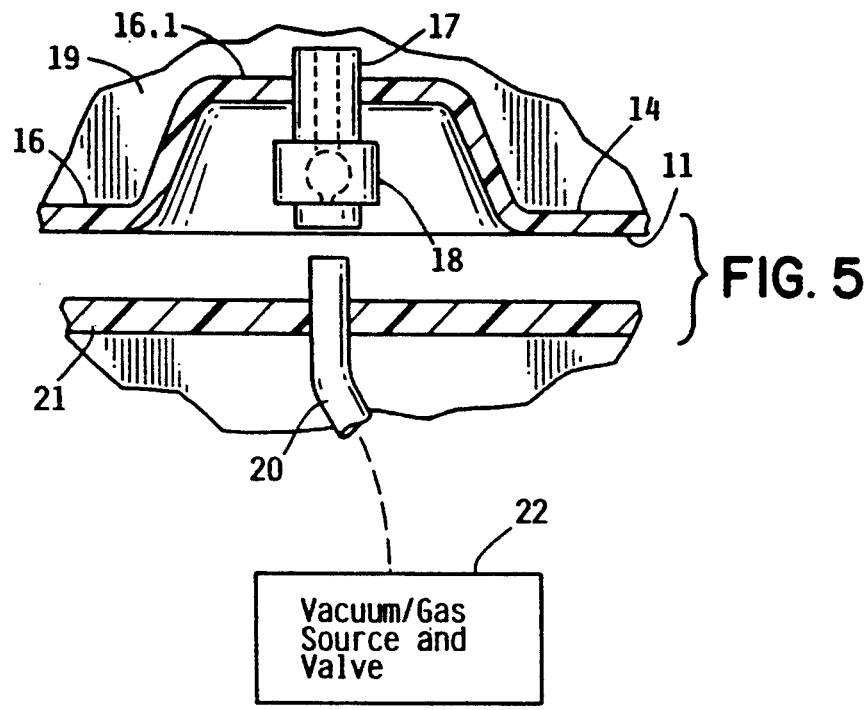
FIG. 5
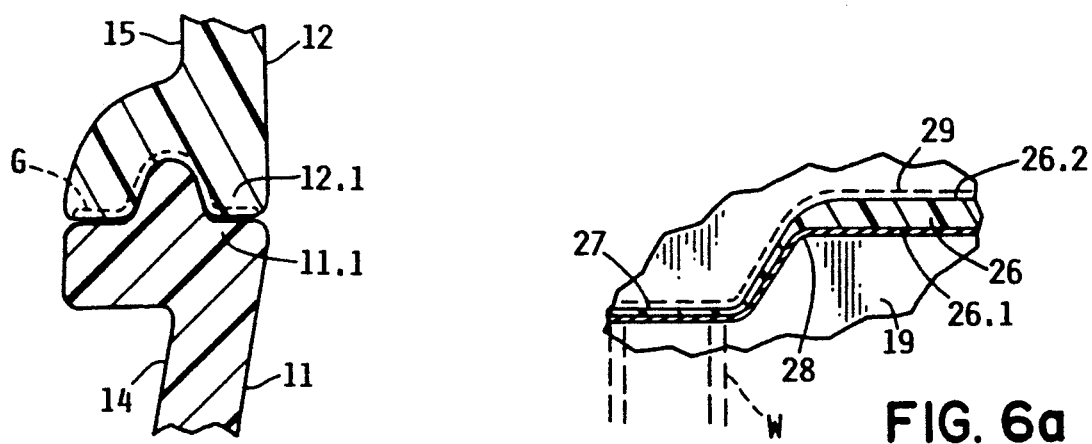
FIG. 6
FIG. 6a

EVACUATED WAFER CONTAINER

This invention relates to devices and methods of storing silicon wafers for handling and shipping semiconductor wafers as they are being processed into circuit chips.

BACKGROUND OF THE INVENTION

As more and more circuits are being applied into smaller and smaller spaces on circuit chips, the need for cleanliness and the minimizing of likelihood of collecting particles becomes more and more important. Previously, containers have been used for enclosing semiconductor wafers for shipping and storage. Processing of semiconductors wafers usually requires the use of a wafer carrier; and containers have been used for confining a wafer carrier full of semiconductor wafers so that when storage has been completed, the wafers can be removed from the container by simply lfiting the wafer carrier out of the container, whereupon the carrier and wafers are ready for immediate processing.

However, in the past, it has been commonly necessary to again clean the wafers as a first step of further processing, in order to remove particles and organic materials that may have been accumulated during storage.

SUMMARY OF THE INVENTION

An object of the invention is to provide an improved container and method for shipping and storing semiconductor wafers and substrates used in production of circuit chips.

A feature of the invention is a container for storing and shipping semiconductor wafers under subatmospheric pressure and wherein the container is of generally stiff or rigid construction to project the wafers and incorporates a flexible membrane or bladder portion located adjacent the edges of a number of wafers within the container as to be drawn by flexing inwardly under influence of the subatmospheric pressure and against the wafers for holding and retaining the wafers against movement within the container.

Still another feature of the invention is a method of confining semiconductor wafers for storage and shipping, wherein the wafers are placed in a multi-part container which is particularly adapted to hold such wafers. The container is closed and sealed, and then at least partially evacuated of air, as to draw the parts of the container into sealed relation, thereby preventing any significant access by particles to the stored wafers.

Where herein reference is made to wafers, the word is meant to refer to semiconductor wafers of silicon, galium arsenide, and other semiconductor materials, photo masks and other substrates used in the manufacture of circuit chips.

DESCRIPTION OF THE DRAWINGS

FIG. 5 is an enlarged detail section view illustrating the gas conveying stem and valve and an adaptor on a tabletop or piece of equipment for alternately drawing a vacuum or relieving the vacuum in the container.

FIG. 6 is an enlarged detail section view taken approximately at 6—6 of FIG. 2 and illustrating the sealed relation between the cover and bottom parts of the container.

FIG. 6a is an enlarged detail section view of a portion of the container illustrated in FIGS. 1-6.

DETAILED SPECIFICATION

Figure 1:
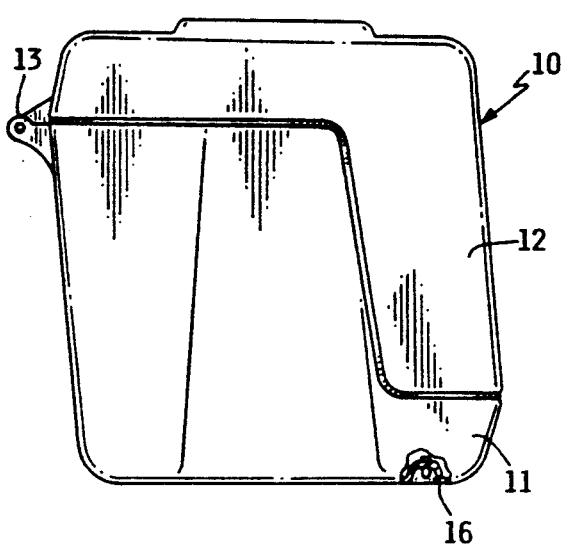
FIG. 1 is a side elevation view of a shipping container for containing a wafer carrier full of semiconductor wafers for storage or shipment.
Figure 2:
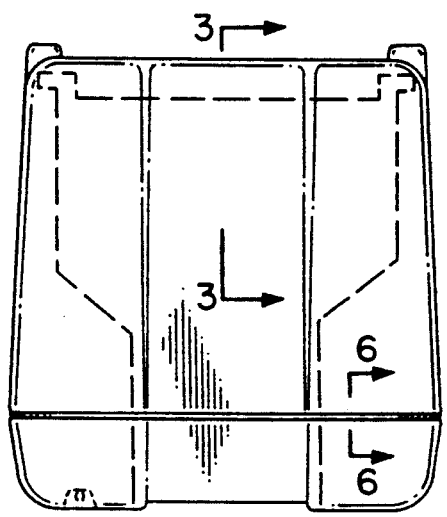
FIG. 2 is an end elevation view of the container in FIG. 1.

FIG. 1 illustrates a container, indicated in general by numeral 10, which is uniquely adapted for storing silicon wafers in a wafer carrier, and it will be noted that the container 10 is a multi-part container with a box bottom 11 and a box top or cover 12 connected together by a hinging structure 13. The cover 12 and box bottom 11 seal together at the joining edge portions 12.1, 11.1, substantially as illustrated in FIG. 6 so that the interior of the box is entirely sealed from ambient conditions at the exterior of the container.

It may be necessary, in some conditions, to utilize a gasket "G" illustrated in dotted lines in FIG. 6 in the joint between the box bottom and the cover so as to obtain a hermetic seal between the two parts of the box. Such a gasket will be formed of a compressively yieldable material and be replaceable for repeated uses of the container 10.

The principal portions of the container 10, i.e. the box bottom and the cover 12, are preferably formed of moldable plastics, such as high density polyethylene or polypropylene or of similar plastic material which is resistive to damage due to breakage and resistive to abrasion. The interior surfaces 14, 15 of the box bottom and cover may be coated with metal or may be diamond coated to prevent any passage of gases through the walls of the box bottom or cover. Accordingly, the box or the container 10, when closed, will be substantially hermetically sealed in its entirety.

The container 10 in one of its walls, such as the bottom wall 16 of the box bottom 11, has a quick connect stem 20 sealingly inserted and carried therein and incorporating a valve 18, for controlling the atmosphere in the interior 19 of the container. Preferably, the portion 16.1 of the wall in which the stem is mounted will be offset so as to shield the stem 20 and valve 18 from any possible physical damage. The quick connect stem 20 and valve 18 is adapted to telescopically receive the nipple end of a gas supply line or vacuum line 19, which may be carried in a tabletop or platform portion 21 of a piece of equipment upon which the container 10 may be placed so that a vacuum and gas source and valve 22 may be connected to the stem 20 and valve 18 as to change the atmosphere within the container 10. The vacuum/gas source 22 will draw a vacuum or reduce the gas pressure within the interior 19 of the container. Alternately, a portion of the gas within the interior 19 of the container may be removed and then subsequently replaced with an inert gas, such as nitrogen, or replaced by filtered air from which air-born particles have been removed.

Figure 3:
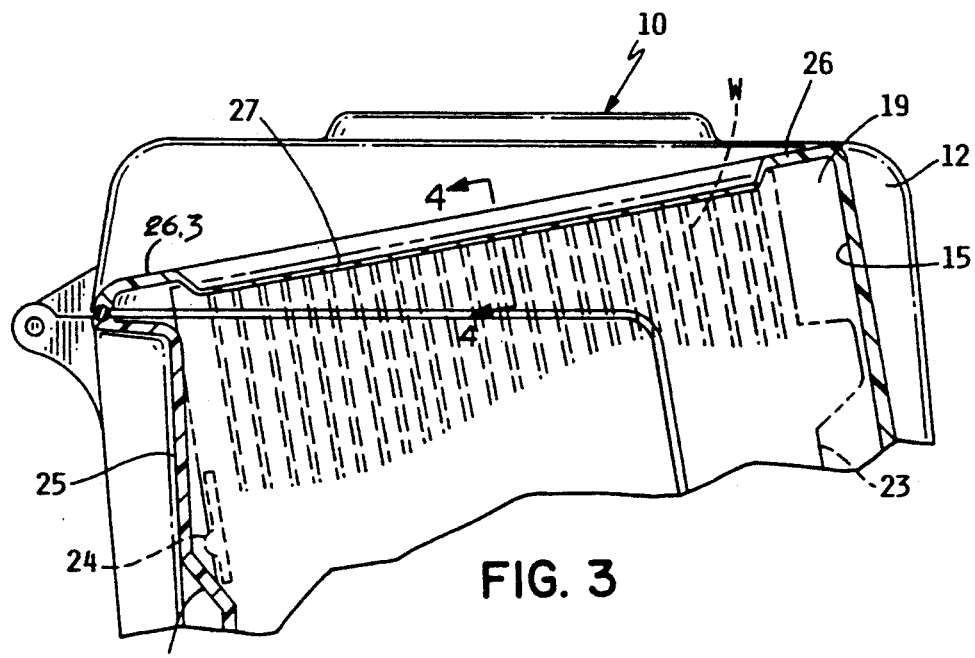
FIG. 3 is a detail section view taken approximately at 3—3 of FIG. 2.
Figure 4:
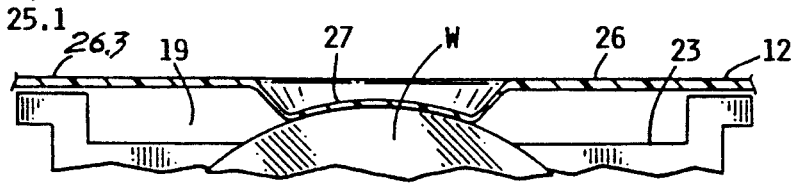
FIG. 4 is a detail section view taken approximately at 4—4 of FIG. 3.

FIG. 3 illustrates that the container 10 is uniquely adapted to contain and store semiconductor wafers which are shown in dotted lines and indicated by the numeral W in FIG. 3.

The wafers W are carried, within the container 10, in a wafer carrier which is indicated in general by numeral 23. Such a wafer carrier is commonly known to persons of skill in the art and is of the general type illustrated in U.S. Pat. No. 4,817,795, and in numerous other patents. Such a wafer carrier 23 has numerous ribs and spaces between the ribs in the sidewalls of the carrier for maintaining the wafers W in spaced and confronting relation with each other; and such a wafer carrier 23 also has an H-bar end 24, which is particularly accommodated by the rear wall 25 of the cover 12 by the offset 25.1. The wafer carrier 23 may be carried, within the container 10, in inclined position so that all of the wafers are inclined to rest against the supporting ribs within the wafer carrier 23.

The top wall 26 of the cover 12 may include a panel portion 27 which is, reduced in thickness as compared to the flat main portion 26.3 of the top wall 26 of cover. The thinness of the panel 27 causes the panel to act like a flexible membrane so as to flex under conditions of vacuum pressure within the interior 19 of the container so that the flexible panel or membrane 27 is drawn inwardly toward the interior 19 of the container relative to the main portion 26.3 of the wall 26, and into engagement with the adjacent edges of the wafers W, and thereby hold the wafers against movement in the wafer carrier 23 and thereby minimize the possibility of breakage of the wafers and minimize the generation of particles which might otherwise occur if the wafers are allowed to move freely in the wafer carrier. Whereas portions of the walls of the cover 12 may have thicknesses in the range of 0.050 to 0.075, and other thicknesses to accommodate edges, hinges and reinforcing locations, the panel 27 will have a thickness, considerably less than the thickness of the top wall, and may have a thickness in the range of 0.010 to 0.040, depending upon the material being used. Of course, other thicknesses may be used in the panel or membrane 27, so long as the panel is flexible under influence of the differential atmospheric pressure within the container as compared to the atmospheric conditions at the exterior.

FIG. 6a illustrates an important detail of the container 10 which has at least the inner surfaces of the walls diamond coated. FIG. 6/illustrates the top wall 26 having its inner surface 26.1 covered by a coating or sheath 28 of diamond-like material, and it will be understood that all of the inner surfaces of all of the walls of the container will be diamond coated. Although the diamond coating 28 is only illustrated on the container 10 of FIGS. 1-6, 6a, the surfaces of all of the forms of container illustrated in this disclosure may be diamond coated. As illustrated, the diamond coating 28 covers the flexible panel 27 as well as the top wall 26 and the other wall portions of the container.

Similarly, the outer surface 26.2 of the top wall may also be optionally covered with a diamond coating or sheath 29, which is shown in dashed lines to suggest the more optional nature of the diamond coating 29.

The material in the diamond-like coating 28 may be otherwise described as diamond, polycrystalline diamond, diamond-like carbon, amorphous diamond, hydrogenated diamond-like carbon, single-crystal heteroepitaxial diamond. In this diamond-like coating, the majority of the carbon atoms are diamond bonded, resulting in a hard, nearly perfect chemically resistant coating which has a low coefficient of friction and is nearly impermeable to liquid and gaseous reagents and other gaseous product, including air. The coating 28 is applied by a chemical vapor deposition (CVD), although the methods of applications of the coating may vary slightly. One technique for depositing the diamond coating uses an ion beam technique. The ion source, preferably about 30 cm in diameter with its extraction grids masked to 10 cm in diameter, is used to directly deposit the diamond-like carbon film. The ion soruce uses argon gas in the hollow cathode located in the main discharge chamber, as well as in the neutralizer. After a discharge is established between the cathode and anode, methane ($CH_4$) is introduced through a manifold into the discharge chamber. For this deposition, the molar ratio methane to argon was 0.28. The ratio was found to be ideal for generating films under one set of conditions. In these procedures, the total ion beam energy is the sum of the discharge voltage and the screen voltage, and is around 100 eV. Typical current densities at these conditions are 1 ma/$cm^2$ at a distance of 2.5 cm axially downstream of the grids. Films are deposited at these conditions and accumulated as needed.

Other methods of deposition may be used and available and certain of them are described in more detail in copending application Ser. No. 734,794 filed Jul. 23, 1991 by the same inventors and under common ownership with the present application, the disclosure from which is incorporated herein by reference.

It will be seen that the present invention provides a container with discreet portions separable for inserting and removing semiconductor wafers, and a valve to gas port in one of the portions of the container for facilitating withdrawing and adding portions of gas atmosphere within the interior portions of the container.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. A wafer storing and shipping container comprising a readily transportable plastic container free of adjoining apparatus and formed of stiff material and comprising interior portions with spacer means supporting the individual wafers in spaced and confronting relation to each other, the container comprising a box bottom portion and a box cover portion bearing against each other and separable from each other for obtaining access to said interior portions, said box bottom and box cover portions being releasably and hermetically sealed together, the interior portion of the plastic container also comprising subatmospheric pressure obtaining retention of the box bottom and box cover portions against each other and one of said box bottom and box cover portions comprising a valve gas port facilitating withdrawing and adding portions of the gas atmosphere within said interior portions, and said box cover portion comprising a top wall portion with a flat main portion and a flexible panel portion comprising a flexible membrane, the flexible panel portion being recessed inwardly toward the interior portions of the plastic container relative to the flat main portion of the top wall portion, said flexible panel portion having reduced thickness relative to the main portion of the top wall portion, and said flexible panel portion flexing inwardly toward said interior portions in response to the subatmospheric pressure of the gas and releasably engaging and retaining wafers confined in the interior portions of the container.

2. A container according to claim 1 wherein said spacer means of the interior portions comprise elongated rows of slots and ribs for maintaining a multiplicity of such wafers in spaced and confronting relation with each other and said membrane extending along the elongate row of slots and ribs.

3. A container according to claim 1 wherein the flexible panel portion is formed integrally and in one piece with said flat main portion and said top wall portion.

* * * * *